United States Patent Office 3,041,258
Patented June 26, 1962

3,041,258

METHOD OF ETCHING AND ETCHING SOLUTION FOR USE THEREWITH

Thomas V. Sikina, Willow Grove, Pa., assignor to the United States of America as represented by the Secretary of the Air Force No Drawing. Filed June 24, 1960, Ser. No. 38,682
2 Claims. (Cl. 204—143)

This invention relates to a novel electrolytic etching solution and method of treating preselected surface portions of semiconducting materials. A more specific aspect of this invention relates to an improved electrolytic jet etching solution and method for use in the fabrication of transistor devices.

In the fabrication of transistor devices, an important intermediate treatment comprises the step of etching selected surface portions of a semiconductor material in order to provide recessed regions of controlled depth and to produce characteristics which are desirable in a finished transistor. Various etchant techniques and etchant solutions have been employed in the past with significant improvement resulting therefrom. Prior art etchant solutions in general are composed of hydrofluoric acid in combination with a suitable oxitizing agent such as hydrogen peroxide, potassium permanganate, or nitric acid, in addition to various other additive materials such as bromine accelerators and acetic acid moderators. Among the different prior art techniques which have proved most suitable for etching semiconductor elements are the electrolytic etching procedures, of which the jet etching technique has been found to be of particular value because it provides an accurate means for controlling dimensional tolerances in the etched cavity areas. Uneven etching is eliminated and selected surface areas may be etched without the necessity of masking any portion of the surface. In brief, this technique provides an element of control not heretofore achieved by other etching techniques. Jet etching itself, however, is a technique which is well known in the art, as exemplified by the patent to Evers entitled "Method for Electrolytic Etching," bearing Patent No. 2,767,137, and forms no part of the instant invention.

A conventional etchant solution which has been found useful for etching N-type silicon semiconducting materials, in conjunction with the jet etching method referred to heretofore, comprises an acidified 0.2 N sodium fluoride mixture which etches at the rate of about one-half mil per minute. In accordance with this invention, however, it has been discovered that the results produced by the jet etching technique may be achieved much more efficiently and rapidly by employing the method and etching solution of this invention. The process steps and the composition of the solution will be hereinafter described in greater detail as specific embodiments of this invention.

Therefore, it is an object of this invention to provide a novel etchant solution and method for etching preselected surface areas of N-type silicon semiconducting materials.

A further object of this invention is to provide an etchant solution and method which will produce etched cavities having accurately controlled dimensional areas.

Still a further object of this invention is to provide an etchant solution and method which will produce etched cavities of a given dimension in a most rapid manner while still maintaining a desirable electro-polishing action in the cavity area.

Still a further object of this invention is to produce an etchant solution and method which will significantly and unexpectedly reduce jet etching time by approximately one-half over that achieved heretofore.

Still another object of this invention is to provide an etchant solution and method which produces etched cavities having substantially flat bottomed areas.

A still further object of this invention is to provide an improved etchant solution and method for electrolytically jet etching semiconductive N-type silicon materials.

Still a further object of this invention is to provide an improved etchant solution and method for controlling the rate of jet etching of preselected surface areas of an N-type silicon semiconductor body.

Still a further object of this invention is to provide an etchant solution and a method of electrolytically jet etching N-type silicon semiconductor bodies utilizing current densities of about 75 to 130 amperes per square inch.

The above and still further objects of this invention will become readily apparent upon consideration of the following detailed descriptions of specific embodiments thereof.

It has been found in accordance with this invention that the afore-stated objects may be accomplished by utilizing an aqueous etching solution comprising sodium fluoride, ammonium bifluoride, sodium ferrocyanide, and hydrofluoric acid. The hydrofluoric acid is employed as a constituent of the etchant solution primarily as an aid in preventing the formation of silicon dioxide on the surface of the silicon body during the etching process. Silicon dioxide would materially interfere with the efficiency of the electrolytic etching process unless washed off. The hydrofluoric acid is a solvent for the silicon dioxide and, thus, allows it to be effectively removed. In addition, the hydrofluoric acid will affect the pH of the etchant solution and a measurement thereof will help to ascertain the correct amount of hydrofluoric acid to be employed.

In the operation of this invention, the electrolytic etching solution is projected against a preselected surface area of a silicon semiconductor material as a jet stream in a manner well known to those skilled in the art. A flow of electric current is applied through the jet stream and contacts preselected surface areas of the semiconductor material and, in conjunction with the etchant solution, produces etched cavities in said surface areas. The semiconductor material comprises a wafer of silicon having N-type conductivity. After etching to the desired thickness, the wafer is processed to form P-type conductivity areas on either side of the etched wafer in a conventional manner, thus producing a silicon blank adaptable for use as a P-N-P silicon transistor.

As a result of using the etchant solution and method of this invention, the jet etching time is significantly reduced, since the etchant solution operates effectively at high total etching currents of from 6–10 milliamperes as opposed to the low etching currents commonly employed in the prior art. This increased conductivity of the jet stream while still maintaining high electro-polishing action in the etched cavity area, is responsible for the increased efficiency which results from the use of the etchant solution of this invention.

The conventional N-type silicon etching solution discussed heretofore requires an etching time of 6 minutes at an etching current of about 6 milliamperes in order to reduce a 3.5 mil silicon blank to 0.5 mil, while still maintaining the desirable high electro-polishing action. This invention, however, produces an etching solution which reduces a 3.5 mil blank to about 0.5 mil in approximately 3 minutes at an etching current of 9–10 milliamperes, while still maintaining the desirable electro-polishing action.

To be more specific, there is shown in Table I a series of tests which discloses the significant reduction in jet etching time achieved by this invention. In Table I, Solution 1 represents an etchant solution employed by the prior art while Solution 2 represents the etchant solution of this invention. A silicon wafer having a resistivity of the order of 1.1–1.5 ohm centimeters and a thickness of 3.7 mils was placed between two oppositely disposed jet nozzles having a diameter of 6 and 8 mils, respectively. The silicon wafers were subjected to electrolytic etching at total etching currents of 6 milliamperes for the prior art etching solution and 9.5 milliamperes for the etching solution of this invention. The specific details of the method employed will be explained in greater detail hereinafter.

TABLE I

SOLUTION #1

| Sample | Blank Thickness (mils) | Total Etching Current, ma. | Time required to observe red light transmission | Etch through time to 0.4 of a mil | Emitter etch pit diameter (mils) | Collector etch pit diameter (mils) | Window diameter (mils) |
|---|---|---|---|---|---|---|---|
| A | 3.7 | 6 | 4 min., 30 sec | 6 min | 32 | 33 | 8 |
| B | 3.7 | 6 | 4 min., 30 sec | 6 min | 32 | 33 | 8 |
| SOLUTION #2 | | | | | | | |
| C | 3.7 | 9½ | 2 min., 15 sec | 3 min., 15 sec | 30 | 32 | 8 |
| D | 3.7 | 9½ | 2 min., 15 sec | 3 min., 15 sec | 31 | 33 | 8 |

As can be seen by reference to Table I, the time required to observe red light transmission, that is, the total etching time for reducing a 3.7 mil-thick silicon wafer to 0.4 mil, is significantly reduced by approximately 50 percent when the etchant solution of this invention is employed.

A more detailed description of the method employed for producing the etched cavities in the silicon wafers disclosed in Table I is set forth as follows: a silicon wafer is positioned between two glass nozzles having diameters of 6 and 8 mils, respectively, in such a manner that preselected oppositely disposed surface areas of the wafer are subjected to impingement by two sharply defined jet streams of an electrolytic etching solution emanating under pressure from the two nozzles. A power supply, whose voltage is maintained constant throughout, is connected to each nozzle and to the silicon wafer so that two loops of current are formed, the current in one loop flowing clockwise; the current in the other loop flowing counter-clockwise. The two currents join in a common return lead from the power supply to the wafer.

The wafer is N-type silicon and, consequently, requires light for electrolytic jet etching. A light is directed on one side of the wafer from 4 Bausch and Lomb microscope lamps, while light from a 300-watt Bantam microscope lamp is directed onto the other side. The two nozzles are supplied with an etching potential, and a total current of 9.5 milliamperes flows through the loops as the etchant solution is projected in the form of a jet stream against the surfaces of the silicon wafer. The light source is directed to illuminate the wafer surfaces impinged by the jet streams. Ordinarily, there will be substantially no visible light transmitted through the wafer upon initiation of the etching process. However, when the thickness of the material remaining between the two jets is reduced to about 0.4 mils, the visible light is red as seen through the wafer from the other side. Consequently, the etched portion is at the desired thickness and the etching action is terminated.

The use of light for ascertaining the termination point for the etching action forms no part of this invention and is more fully disclosed in U.S. Patent No. 2,875,140, to T. V. Sikina, issued February 24, 1959, which patent also discloses a suitable apparatus for use with the method and composition of this invention.

The rate of electrolytic etching is determined in large measure by the density of the etching current existing between the jet and the region of the silicon wafer impinged thereby. When the novel etching solution of this invention was employed, it was found that to etch the same size wafer to the same predetermined thickness as before, less etching time was required even beginning with the same value, e.g., 6 milliamperes, of current as was previously found to be optimum. In an attempt to maximize the improvement, the current was increased in a number of steps until it was found that the best electro-polishing result for the shortest time was attained when the current in the common return path to the power supply was at 9.5 milliamperes. Since this value represents current from both loops, the value of current required for the improved action in etching one pit on one side of the wafer is proportional to the cross-sectional area of the jet and since the respective areas of the 6 and 8 mil jets are related in the ratio of the squares of their respective radii, that is, 9 and 16, the contribution of the 6 mil and 8 mil jet to the total current is 3.42 milliampere and 6.08 milliampere, respectively. These values may be calculated as follows:

CALCULATION NO. 1

$$\frac{(3^2)(9.5)}{25}=3.42 \text{ m.a.}$$

$$\frac{(4^2)(9.5)}{25}=6.08 \text{ m.a.}$$

As the jet-etch time is related to the amount of current per unit area, the current density at 9.5 milliampere total current from the 6 and 8 mil nozzles would be about 121.02 and 121.02 amperes per square inch, respectively. The current densities are calculated as follows:

CALCULATION NO. 2

$$\frac{(3.42)(10^{-3})}{(3^2)(\pi)(10^{-6})}=121.02 \text{ a./in.}^2$$

$$\frac{6.08(10^{-3})}{(4^2)(\pi)(10^{-6})}=121.02 \text{ a./in.}^2$$

As can be seen by the above, the optimum total current for producing the etched cavities when employing a 6 and an 8 mil jet simultaneously is 9.5 milliamperes; however, improvement was found to exist when employing total etching currents of from 6–10 milliamperes. The currents contributed by the 6 and 8 mil jets when employing a total of 6 milliamperes, or 10 milliamperes current, and their corresponding current densities may be similarly calculated in accordance with the calculations set forth above when using a total current of 9.5 milliamperes. Thus, a range of current density from about 75 to 130 per jet nozzle has been found to produce a significant improvement in jet etching time.

In accordance with the above, therefore, it can be seen that for a given cavity area, the novel method and etchant solution of this invention significantly reduces jet etching time in a simple and efficient manner while still maintaining desirable electro-polishing and provides a means for producing transistor devices where maximum yield is desired for a given period of time.

A further advantage of the instant invention resides in the fact that the etchant solution and method described herein produce etched cavities having straight-sided, flat-bottomed depressions with substantially parallel opposite surfaces, as is desired for many high frequency semiconductive devices. The etched regions on the oppositely disposed surfaces of the silicon wafer produce a window-like area, sufficiently thin and having sufficiently parallel opposite surfaces, that marked improvements in frequency response and/or gain of the transistor device is achieved. The remaining portion of the wafer is sufficiently thick to provide strong support for the thin region and to provide a relatively low resistance current path from the region of the reduced thickness to an external circuit connection as is desirable in reducing the base resistance of the structure when used in a homogeneous two-element base transistor having emitter and collector etch pits.

After completion of the etching process, it is generally advantageous to wash the etched semiconductor wafer in a purified fluid such as methyl alcohol or distilled water in order to remove all traces of the etchant solution. The semiconductor wafer is then dried in a blast of air. At the end of this operation, contacts may be affixed to the semiconductor wafer in the usual manner and the transistor completed by mounting and covering.

With the foregoing discussion in mind, a detailed specific example of the etchant solution of this invention is presented herewith. This solution contains the following ingredients per liter of water:

| | |
|---|---|
| Sodium fluoride | 8.4 grams. |
| Ammonium bifluoride | 4.0 grams. |
| Sodium ferrocyanide | 2.0 grams. |
| Hydrofluoric acid | Sufficient to adjust the pH to 3.5. |

It will be understood that while the method and composition disclosed herein illustrate a preferred form of the invention, modifications can be made by those skilled in the art without departing from the spirit and scope of the invention and that all the modifications that fall within the scope of the appended claims are intended to be included herein.

What is claimed is:

1. A method of producing etched cavities in preselected surface areas of a silicon semiconductor material comprising the steps of impinging an electrolytic etchant solution against said preselected surface areas in the form of a jet stream, said etchant solution consisting essentially of the following ingredients per liter of water, sodium fluoride 8.4 gms., ammonium bifluoride 4.0 gms., sodium ferrocyanide 2.0 gms., hydrofluoric acid sufficient to adjust the pH thereof to 3.5, applying an electric current through said jet stream in contact with said preselected surface areas at a current density of from about 75 to 130 amperes per square inch in order to electrolytically etch said surface areas, continuing said electrolytic etching action for a period of time sufficient to produce predetermined dimensions in said etched areas, terminating said etching action and removing said etching solution from said surface areas.

2. A solution particularly adapted for producing electrolytic etched cavities in preselected surface portions of a silicon semiconductor material, said solution consisting essentially of the following ingredients per liter of water, sodium fluoride 8.4 gms., ammonium bifluoride 4.0 gms., sodium ferrocyanide 2.0 gms., hydrofluoric acid sufficient to adjust the pH thereof to 3.5.

References Cited in the file of this patent

UNITED STATES PATENTS

| | | |
|---|---|---|
| 2,873,232 | Zimmerman | Feb. 10, 1959 |
| 2,913,383 | Topfer | Nov. 17, 1959 |
| 2,945,789 | Williams | July 19, 1960 |